(12) United States Patent
Ni et al.

(10) Patent No.: US 7,135,769 B2
(45) Date of Patent: Nov. 14, 2006

(54) SEMICONDUCTOR PACKAGES AND METHODS OF MANUFACTURING THEREOF

(75) Inventors: Ching-Yu Ni, Shinchu (TW); Tsorng-Dih Yuan, Hsinchu (TW); Hsin-Yu Pan, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 10/907,327

(22) Filed: Mar. 29, 2005

(65) Prior Publication Data

US 2006/0220225 A1    Oct. 5, 2006

(51) Int. Cl.
*H01L 23/34* (2006.01)
(52) U.S. Cl. .......................... 257/712; 257/704
(58) Field of Classification Search ............... 257/712, 257/704
See application file for complete search history.

(56) References Cited

U.S. PATENT DOCUMENTS

| | | | |
|---|---|---|---|
| 6,118,177 | A | 9/2000 | Lischner et al. |
| 6,285,078 | B1 | 9/2001 | Nelson |
| 6,756,668 | B1 | 6/2004 | Baek et al. |
| 6,891,259 | B1 * | 5/2005 | Im et al. ............ 257/687 |

* cited by examiner

*Primary Examiner*—Roy Potter
(74) *Attorney, Agent, or Firm*—Baker & McKenzie LLP

(57) ABSTRACT

Described are semiconductor package devices with improved reliability and methods of manufacturing thereof. In one embodiment, a package device is disclosed that includes a chip having an active surface and a coupling surface opposite the active surface, where the chip has one or more integrated circuits and bumps. The device also includes a thermal spreader thermally coupled to the coupling surface of the chip for dissipating heat generated by the chip, and a thermal interface material located between the thermal spreader and the coupling surface of the chip for improving the heat dissipation. In addition, the device also includes a boundary material located between the thermal spreader and the coupling surface of the chip, where the boundary material is configured to surround a perimeter of the thermal interface material to maintain the thermal interface material between the thermal spreader and the coupling surface of the chip.

9 Claims, 3 Drawing Sheets

SEMICONDUCTOR PACKAGES AND METHODS OF MANUFACTURING THEREOF

BACKGROUND OF THE INVENTION

The packaging of integrated circuit (IC) chips is one of the most important steps in the manufacturing process, contributing significantly to their overall cost, performance and reliability. Packaging of IC chips account for a considerable portion of the cost of producing the device, and failure of the package can lead to costly yield reduction. One of the approaches taken to solve such packaging problems is the development of "flip-chip" semiconductor packages.

A flip-chip packaged device includes a direct electrical connection of face down (that is, "flipped") electronic components onto substrates, such as ceramic substrates, circuit boards, or carriers using conductive solder bumps formed in a ball grid array (BGA) on bond pads of the chip. Flip-chip technology is quickly replacing older wire bonding technology that uses face up chips with a wire connected to each pad on the chip. Flip-chip technology fabricates bumps (typically Pb/Sn solders) on aluminum bond pads on the chips, and interconnects the bumps directly to the package media, which are usually ceramic- or plastic-based.

The bumps of the flip-chip assembly serve several functions. The bumps provide an electrical conductive path from the IC chip (or die) to the substrate on which the chip is mounted. A thermally conductive path is also provided by the bumps to carry heat from the chip to the substrate. The bumps also provide part of the mechanical mounting of the chip to the substrate. A spacer is also provided by the bumps, which prevents electrical contact between the chip and the substrate connectors. Furthermore, the bumps also act as a short lead to relieve mechanical strain between the chip and the substrate.

In addition to bumps and spacers, metal heat spreaders or heat sinks can be utilized to dissipate the considerable amount of heat generated during operation of flip-chip packaged devices. The chips are attached to the metal heat spreaders with a thermal interface material (TIM) to decrease the thermal resistance between the chip and the metal heat spreaders.

Despite providing numerous advantages, such flip-chip packaged devices or assemblies are very delicate structures, the design and manufacturing of which creates difficult and unique technical problems. For example, the substrate onto which the flip-chip may be mounted can be a single layer structure, or the substrate may comprise two or many more layers of materials. Often these materials tend to be quite diverse in their composition and structure. The coefficient of thermal expansion (CTE) for these different layers may be considerably different and may result in uncontrolled bending or thermally induced substrate surface distortions.

Furthermore, there may also be potential CTE mismatch between the chip and the substrate resulting in additional warpage or distortion. Such distortions can cause failure of the flip-chip or other components of the substrate. In particular, the TIM can suffer from vertical compression and be pumped out from between the chip and the heat spreader after long power-cycle periods. This is especially true when the TIM is a non-solid material such as a silicon-oil-based AlN (aluminum nitride) filled thermal grease. The thermal grease "pump-out" issue can therefore lead to early failure of the flip-chip packaged devices resulting in poor reliability and thermal performance. Thus there exists a need to minimize the "pump-out" issue by improving the TIM reliability within a flip-chip package.

SUMMARY OF THE INVENTION

Described are semiconductor package devices with improved reliability and methods of manufacturing thereof. In one embodiment, a package device is disclosed that includes a chip having an active surface and a coupling surface opposite the active surface, where the chip has one or more integrated circuits and bumps. The device also includes a thermal spreader thermally coupled to the coupling surface of the chip for dissipating heat generated by the chip, and a thermal interface material located between the thermal spreader and the coupling surface of the chip for improving the heat dissipation. In addition, the device also includes a boundary material located between the thermal spreader and the coupling surface of the chip, where the boundary material is configured to surround a perimeter of the thermal interface material to maintain the thermal interface material between the thermal spreader and the coupling surface of the chip.

DETAILED DESCRIPTION OF THE EMBODIMENTS

Figure 1:
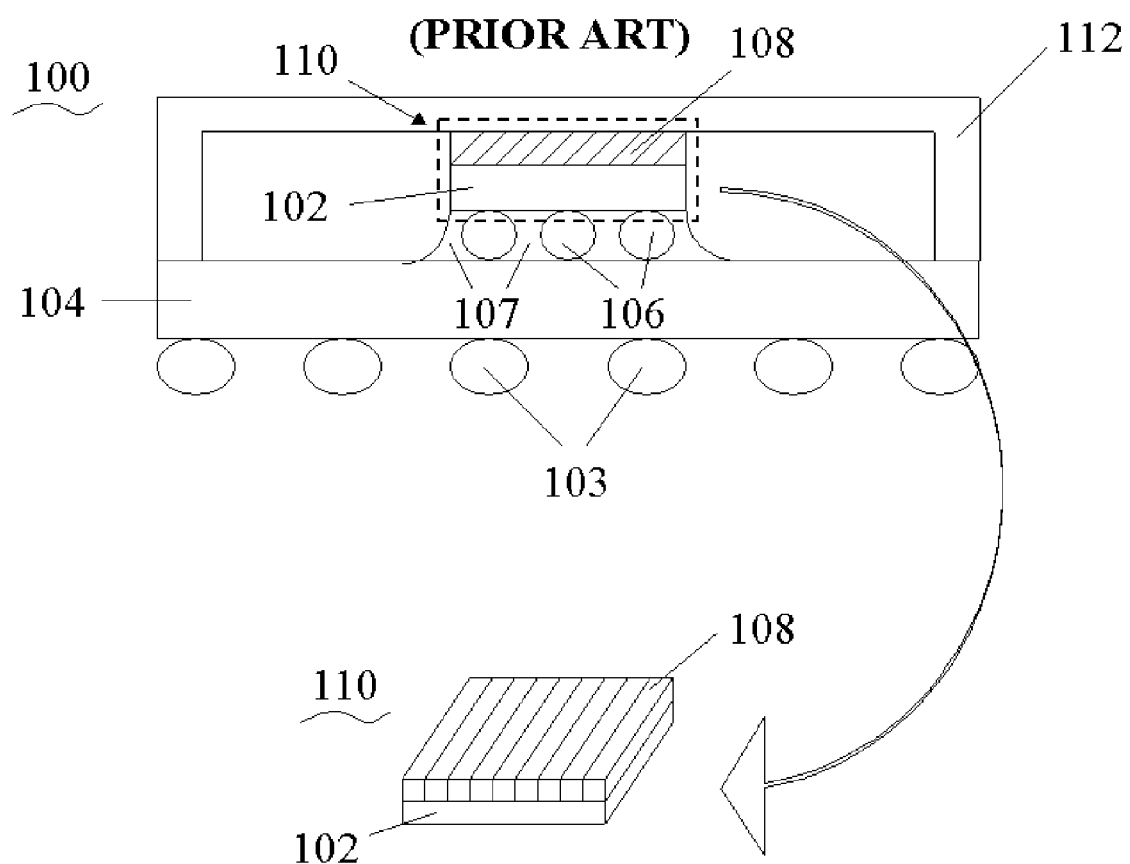
FIG. 1 illustrates a cross-sectional view of a conventional prior-art semiconductor package along with a close-up angled view.

Initial reference is made to FIG. 1, which is a cross-sectional view of a conventional prior-art semiconductor package 100. The package 100 as illustrated in the figure may be a flip-chip (FC) package or a single-inline package (SIP). Integrated circuits and other active devices (not shown) are initially formed on a semiconductor chip 102. Solder bumps (balls) 106 are subsequently formed on the surface containing the integrated circuits and other active devices using known methods and techniques. The solder bumps 106 are usually spherical balls formed of lead, gold, silver, tin, or a mixture thereof.

The semiconductor chip 102, along with the solder bumps 106, is then flip-chip bonded to a substrate 104 using known flip-chip bonding techniques with the solder bumps 106 on the chip 102 coming into physical contact with the substrate 104. An underfill material 107, such as an epoxy encapsulant, is subsequently injected for enhanced package stability and reliability. The substrate 104 can be either ceramic, organic, or printed circuit boards depending on the application. In addition, the substrate 104 can subsequently contain electrical connections 103 that are conductively connected to the integrated circuits and other active devices on the chip 102. The electrical connections 103 may be additional solder bumps (as illustrated) to serve as electrical connections 103 to another substrate (not shown), or in some cases, the electrical connections 103 may be electrical terminals (not shown) that carry signals out of the integrated circuits and other active devices on the chip 102 to an external system (not shown).

Once a semiconductor chip 102 has been flip-chip bonded to a substrate 104, the inactive surface (surface opposite of the active surface) of the chip 102 can then be subjected to additional thermal management enhancements. One of these enhancements is the incorporation of thermal spreaders 112, sometimes referred to as heat sinks or heat pipes 112. Typical thermal spreaders 112 are made of metallic materials such as aluminum, gold, copper, silver, mixtures of metallic components, or other thermally conductive material that can effectively dissipate or disperse the heat away from the chip 102. By spreading the heat away from the chip 102, the integrated circuits and other active devices on the chip 102 are thereby kept at relatively low temperatures. Integrated circuits and other active devices operating at lower temperatures translate into higher reliability and performance, since high operational temperatures have been known to cause early and sometimes accelerated device failures.

The thermal spreaders 112 can come in a variety of shapes and sizes as feasibly permitted depending on space and design. In particular, as illustrated in the figure, the thermal spreader 112 is shaped like a lid or in the shape of an upside-down "U" that covers the entire chip 102 and extends from the top of the inactive surface of the chip 102 to the top of the surface of the substrate 104 bonded to the chip 102. Another thermal spreader 112 design may call for a dome-shaped coverage that also extends from the top of the inactive surface of the chip 102 to the top of the surface of the substrate 104 bonded to the chip 102. Yet another thermal spreader 112 design may simply include a layer of metallic material sitting substantially over the chip 102 without making physical contact to any surface of the substrate 104.

To better facilitate the thermal coupling between the thermal spreader 112 and the semiconductor chip 102, a thermal interface material (TIM) 108 is subsequently formed between the thermal spreader 112 and the semiconductor chip 102 as illustrated in the figure. Although the TIM 108 is normally formed over the inactive surface of the chip 102 prior to the addition of the heat spreader 112, there may be times where the heat spreader 112 is first formed over the inactive surface of the chip 102 and the TIM 108 is added during subsequent processing steps.

The TIM 108 serves to decrease thermal resistance that can take place between the heat spreader 112 and the semiconductor chip 102. Furthermore, if correctly chosen, the proper TIM 108 can greatly expedite the rate of heat dissipation. In other times, instead of having the thermal spreader 112 bonding to the semiconductor chip 102 via a TIM 108, a semiconductor chip 102 may bond to another semiconductor chip 102 or to multiple semiconductor chips 102 via multiple TIMs 108 to form a multi-chip module (MCM) platform (not shown). A MCM allows multiple integrated circuits or active devices to be mounted to a single component package 100 for added functionality and performance, but at added processing complexity and challenges.

Looking at the angled close-up view 110 of the TIM 108 and the semiconductor chip 102, a conventional TIM 108 as illustrated is a uniform film evenly applied between the inactive surface of the chip 102 and the heat spreader 112. One type of TIM 108 that can be applied is a silicon-oil-based AlN filled thermal grease, which has good thermal properties for facilitating the heat transfer between the chip 102 and the heat spreader 112. In addition to the thermal benefits, the TIM 108 can also serve as a material buffer by reducing the mechanical stress when the package 100 warps due to mismatching coefficients of thermal expansion (CTE) between the chip 102 and the substrate 104.

A uniform film of TIM 108 as illustrated in the conventional package 100, however, has continued to exhibit poor device reliability under repeated device operating conditions. For example, if a non-solid material such as thermal grease or thermal gel is utilized as the TIM 108, there are associated "pump-out" issues. The pump-out issue occurs when the chip 102 is powered and the integrated circuits and other active devices are subjected to a temperature cycle. This occurs when the integrated circuits and other active devices are operational. As the temperature of the chip 102 increases due to the devices being under operation, different materials will expand at different rates based on their individual CTE. The greater the CTE mismatch, the greater is the thermally induced warpage or distortion in the chip 102 and the substrate 104. As a result of the distortions, the TIM 108 will experience repeated vertical compression under power cycling and device operating conditions. Consequently, the non-solid TIM 108, thermal grease in this case, gets pushed or pumped out from between the chip 102 and the heat spreader 112, thereby severing the thermal contact between the chip 102 and the heat spreader 112 facilitated by the thermal grease 108. In doing so, devices will start to heat up and eventually fail due to overheating. Using other non-solid or solid TIMs 108 in place of the thermal grease will not alleviate the "pump-out" issue because this is a thermally and mechanically induced phenomenon as a result of the CTE mismatch between the chip 102 and the substrate 104.

Figure 2:
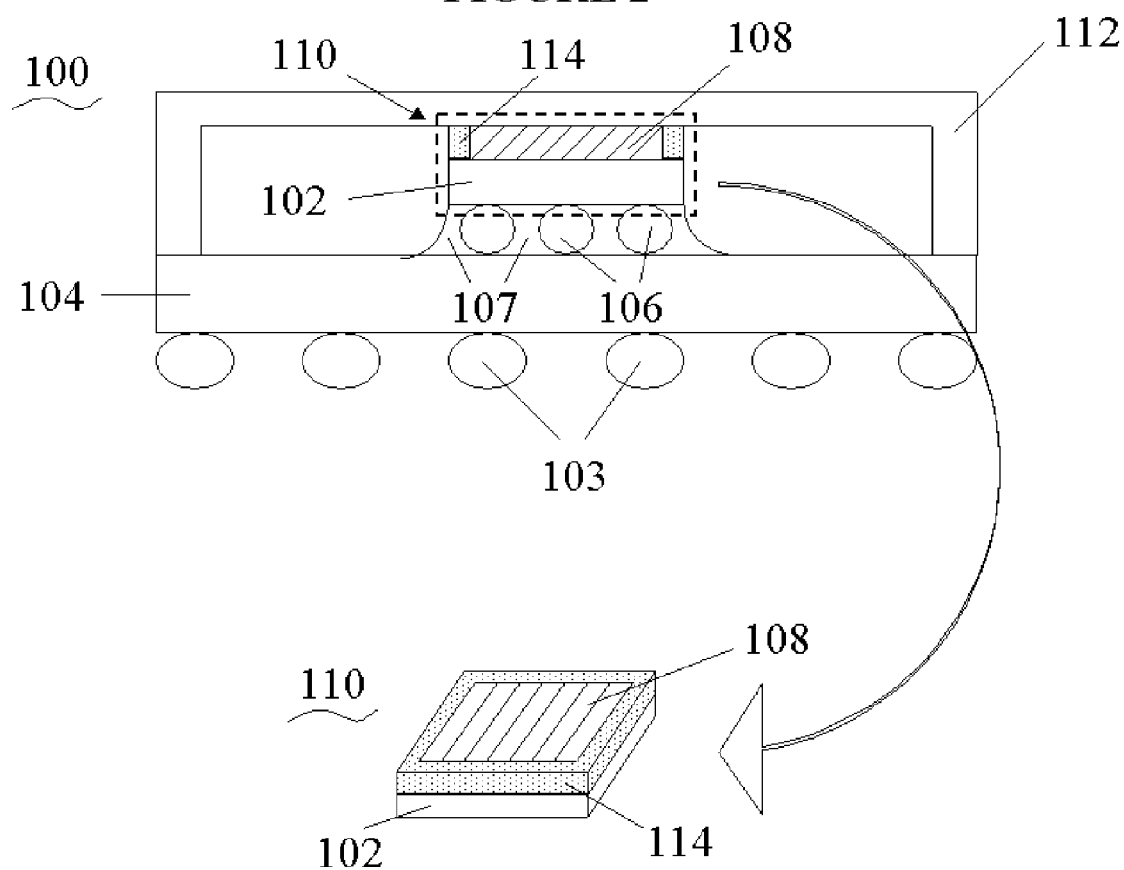
FIG. 2 illustrates a cross-sectional view of a semiconductor package utilizing the presently disclosed embodiments along with a close-up angled view.

A presently disclosed package embodiment is illustrated in FIG. 2, which closely resembles that of FIG. 1, with the exception of the interfaces surrounding the TIM 108. As shown, in addition to using a uniform TIM 108 to thermally couple the chip 102 and the heat spreader 112, one embodiment is to add a boundary material 114 that surrounds and encircles the TIM 108. This boundary material 114 may be added onto the inactive surface of the chip 102 before or after the addition of the conventional TIM 108. The boundary material 114 can be a polymer or a polyester-based material such as polytetrafluoroethylene (PTFE). In addition, the boundary material 114 may also be a non-metallic material or a solid material that can sufficiently surround and provide stability for the TIM 108.

Although the TIM 108 as illustrated in the figure has a square shape with its perimeter surrounded by the boundary material 114, the TIM 108, as well as the boundary material 114, can take on arbitrary shapes and sizes depending on the chip size, application, and assembly tolerance. For example, if the TIM 108 has a rectangular shape, then the boundary material 114 will be shaped like a corresponding rectangular frame to encompass the perimeters of the rectangular TIM 108. Furthermore, if the TIM 108 is rounded or shaped like a circle, then the boundary material 114 will be shaped like that of a donut and surround the outer circumference of the circular TIM 108. The boundary material 114 in essence serves to reinforce and reaffirm the integrity of the TIM 108. By doing so, the boundary material 114 can prevent the TIM 108 from being squeezed out during repetitive operating conditions. In other words, the boundary material 114 serves as a shield that guards the TIM 108 by preventing the TIM 108 from undergoing the "pump-out" phenomenon. In another embodiment, the boundary material 114 may operate by itself as the TIM 108 between the chip 102 and the heat spreader 112.

Figure 3:
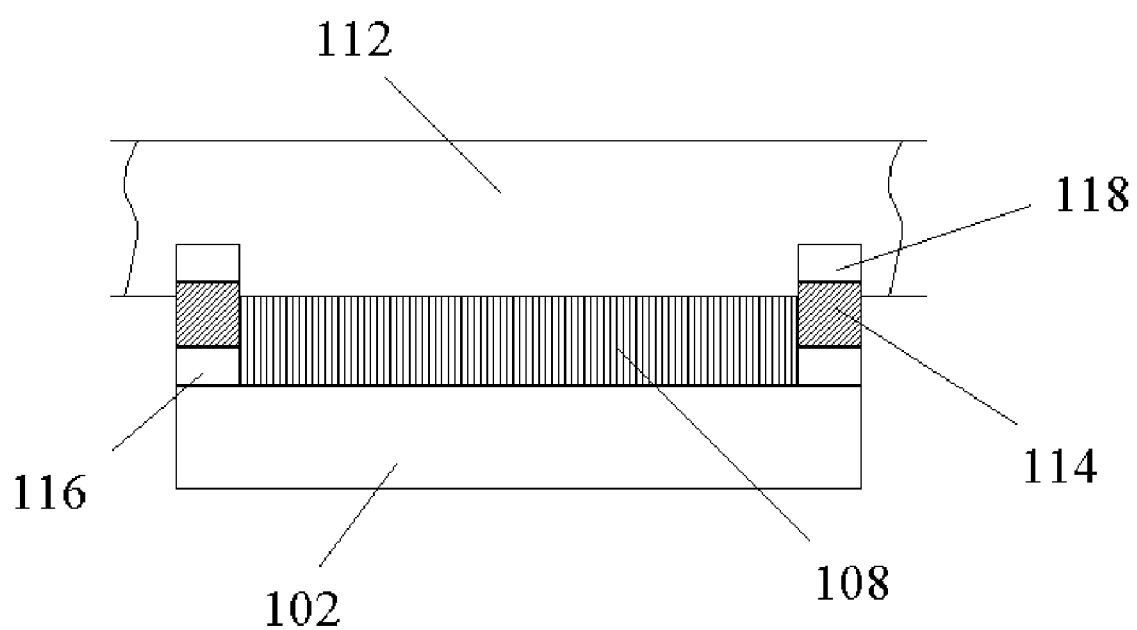
FIG. 3 illustrates a cross-sectional close-up view of a semiconductor package utilizing the presently disclosed embodiments.

Additional reference is made to FIG. 3, which is a cross-sectional close-up view of another embodiment. As illustrated in the figure, the chip 102 is thermally coupled to the heat spreader 112 via the TIM 108. In addition, the boundary material 114 surrounds the TIM 108 to provide the added security. In another embodiment, an adhesive 116 may be utilized to improve the adhesion between the chip 102 and the boundary material 114. The adhesive 116 may be added on the inactive surface of the chip 102 before the addition of the boundary material 114, and may be added before or after the addition of the TIM 108. In another embodiment, the boundary material 114 has been adhered to the chip 102 but is allowed to hang loosely and protrude from the chip 102 in order to freely engage the heat spreader 112 during subsequent processing steps for added placement flexibility. In yet another embodiment, a ditch or a recessed region 118 may be formed in the heat spreader 112 in order to accommodate the boundary material 114 and the TIM 108, with the recessed region 118 of the heat spreader 112 configured to receive the TIM 108 and the boundary material 114 when the chip 102 and the heat spreader 112 are thermally coupled or pushed together.

It will be appreciated by those of ordinary skill in the art that the invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes that come within the meaning and ranges of equivalents thereof are intended to be embraced therein.

Additionally, the section headings herein are provided for consistency with the suggestions under 37 C.F.R. § 1.77 or otherwise to provide organizational cues. These headings shall not limit or characterize the invention(s) set out in any claims that may issue from this disclosure. Specifically and by way of example, although the headings refer to a "Technical Field," the claims should not be limited by the language chosen under this heading to describe the so-called technical field. Further, a description of a technology in the "Background" is not to be construed as an admission that technology is prior art to any invention(s) in this disclosure. Neither is the "Summary of the Invention" to be considered as a characterization of the invention(s) set forth in the claims found herein. Furthermore, any reference in this disclosure to "invention" in the singular should not be used to argue that there is only a single point of novelty claimed in this disclosure. Multiple inventions may be set forth according to the limitations of the multiple claims associated with this disclosure, and the claims accordingly define the invention(s), and their equivalents, that are protected thereby. In all instances, the scope of the claims shall be considered on their own merits in light of the specification, but should not be constrained by the headings set forth herein.

What is claimed is:

1. A semiconductor package, comprising:
   a chip having an active surface and a coupling surface opposite the active surface, the chip having one or more integrated circuits and bumps;
   a thermal spreader thermally coupled to the coupling surface of the chip;
   a thermal interface material located between the thermal spreader and the coupling surface of the chip;
   a boundary material located between the thermal spreader and the coupling surface of the chip, the boundary material surrounding a perimeter of the thermal interface material to maintain the thermal interface material between the thermal spreader and the coupling surface of the chip; and
   an adhesive material located between the boundary material and the coupling surface of the chip.

2. A package according to claim 1, further comprising a substrate having an upper surface and a lower surface opposite the upper surface, wherein the active surface of the chip is flip-chip bonded to the upper surface of the substrate using electrical connections extending between the substrate and the chip.

3. A package according to claim 1, wherein the boundary material is a polymer material.

4. A package according to claim 3, wherein the polymer material is selected from the group consisting of polyester-based material and polytetrafluoroethlene (PTFE).

5. A package according to claim 1, wherein the perimeter of the thermal interface material maintains a shape selected from the group consisting of a rectangle, a square, and a circle.

6. A package according to claim 1, wherein the thermal interface material is selected from the group consisting of thermal grease, air, and thermal gel.

7. A package according to claim 1, wherein the thermal spreader comprises a recess region configured to receive at least a portion of the boundary material.

8. A package according to claim 1, wherein the thermal interface material comprises a thickness less than a thickness of the boundary material.

9. A package according to claim 1, wherein the boundary material is in moveable contact with the thermal spreader.

* * * * *